United States Patent
Neumann

(10) Patent No.: US 12,249,779 B2
(45) Date of Patent: Mar. 11, 2025

(54) CIRCUIT BOARD CONNECTION SYSTEM, APPARATUS, AND METHOD

(71) Applicant: Aptiv Technologies AG, Schaffhausen (CH)

(72) Inventor: Markus Neumann, Nuremberg (DE)

(73) Assignee: Aptiv Technologies AG, Schaffhausen (CH)

( * ) Notice: Subject to any disclaimer, the term of this patent is extended or adjusted under 35 U.S.C. 154(b) by 349 days.

(21) Appl. No.: 17/813,067

(22) Filed: Jul. 18, 2022

(65) Prior Publication Data

US 2023/0033373 A1 Feb. 2, 2023

Related U.S. Application Data

(60) Provisional application No. 63/227,043, filed on Jul. 29, 2021.

(30) Foreign Application Priority Data

Jun. 9, 2022 (EP) .................................... 22178094

(51) Int. Cl.
*H01R 12/72* (2011.01)
*H01R 12/71* (2011.01)
*H01R 12/73* (2011.01)

(52) U.S. Cl.
CPC ......... *H01R 12/721* (2013.01); *H01R 12/716* (2013.01); *H01R 12/732* (2013.01)

(58) Field of Classification Search
CPC .. H01R 12/721; H01R 12/716; H01R 12/732; H01R 12/73; H01R 23/725; H01R 9/096

(Continued)

(56) References Cited

U.S. PATENT DOCUMENTS 5,455,742 A * 10/1995 Phoy ...................... H05K 3/366
174/250
6,155,842 A * 12/2000 Baitz ...................... G06F 1/186
439/74

(Continued)

FOREIGN PATENT DOCUMENTS

DE 102005034664 10/2006
DE 202010012786 U1 12/2010

(Continued)

OTHER PUBLICATIONS

"Extended European Search Report", EP Application No. 22178094. 3, Dec. 20, 2022, 9 pages.

(Continued)

*Primary Examiner* — Gary F Paumen
(74) *Attorney, Agent, or Firm* — Harness, Dickey & Pierce, P.L.C.

(57) ABSTRACT

System for enabling circuit board surface-slot-edge connections. A main board includes a slot through its surfaces. At least one edge of the slot includes electrical contacts to the main board. An auxiliary board includes a connector component mounted on a surface that opposes a surface of the main board. When the connector component is aligned with the slot, the connector component can protrude vertically through the slot, in addition to moving laterally towards an edge of the slot. Electrical contacts on the edge of the slot can engage with electrical contacts in the connector component. This enables two boards to be arranged closely, without extending the main surface in an orthogonal or lateral direction, using a secure connection provided by a connector attached to the auxiliary board, rather than the main board.

18 Claims, 7 Drawing Sheets

(58) Field of Classification Search
USPC .................................................. 439/629, 74
See application file for complete search history.

(56) References Cited

U.S. PATENT DOCUMENTS

| | | | |
|---|---|---|---|
| 10,553,968 | B2 | 2/2020 | Consoli et al. |
| 10,617,007 | B2 | 4/2020 | Perez-Uria et al. |
| 10,741,950 | B1 | 8/2020 | Consoli et al. |
| 2002/0016092 | A1* | 2/2002 | Dibene, II ............. H05K 3/368 439/74 |
| 2009/0035958 | A1* | 2/2009 | Liao ....................... H01R 12/73 439/66 |
| 2021/0075163 | A1 | 3/2021 | Takai et al. |
| 2021/0111515 | A1 | 4/2021 | Consoli |

FOREIGN PATENT DOCUMENTS

| | | | | |
|---|---|---|---|---|
| EP | 1953871 | A2 | 8/2008 | |
| EP | 3562280 | A1 | 10/2019 | |
| EP | 4011665 | A1 * | 6/2022 | ............. B60J 7/043 |
| FR | 3028132 | A1 | 5/2016 | |
| GB | 793785 | A | 4/1958 | |

OTHER PUBLICATIONS

"Board-to-Board Connectors", Molex, Retrieved from https://www.molex.com/molex/products/group/board_to_board_connectors on Jul. 14, 2022, 5 pages.
"Board-to-Board", KYOCERA AVX Components Corporation, Retrieved from https://www.kyocera-avx.com/products/connectors/board-to-board/ on Jul. 14, 2022, 4 pages.
"Card Edge Connector Types", TE Connectivity, Retrieved from https://www.te.com/usa-en/products/connectors/pcb-connectors/card-edge-connectors.html on Jul. 14, 2022, 7 pages.
"Connector Product Overview for Advanced Interconnects", TTI Europe—Electronic Components Distributor, Retrieved from https://www.ttieurope.com/content/dam/tti-europe/resources/Literature/SupplierGuides/0-2038_Molex_TTI_co-branded_AW.pdf on Jul. 14, 2022, 52 pages.

* cited by examiner

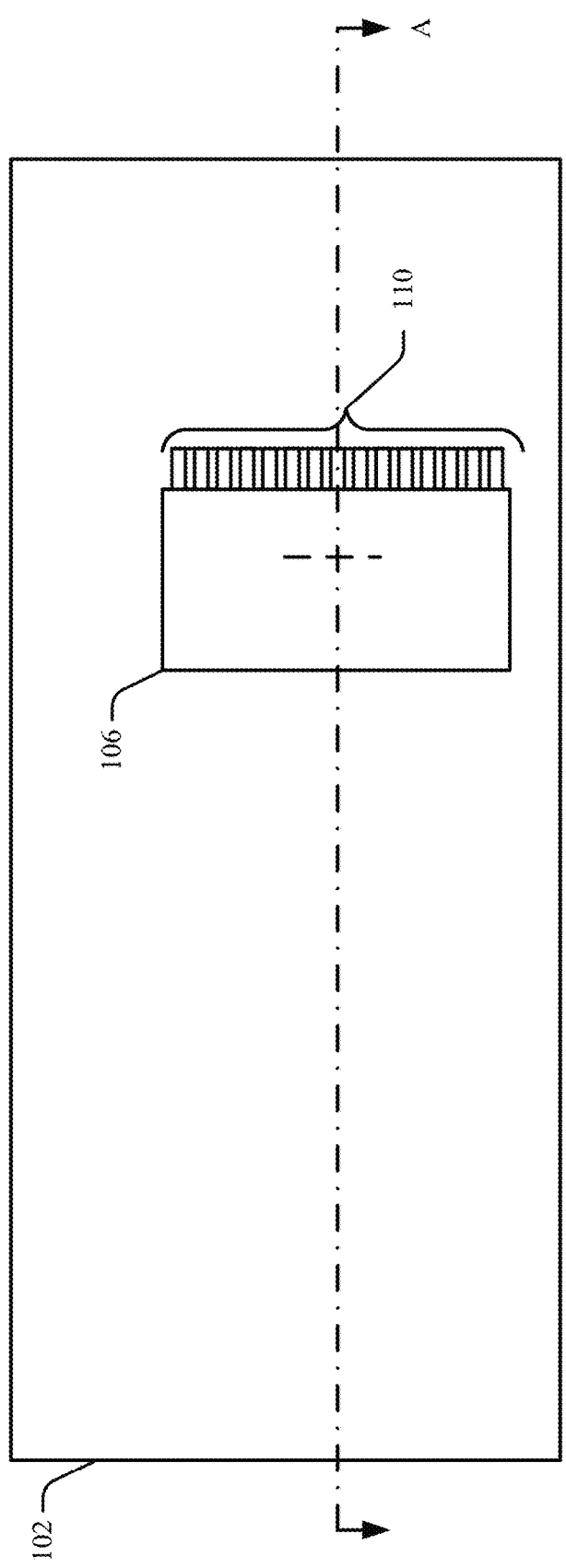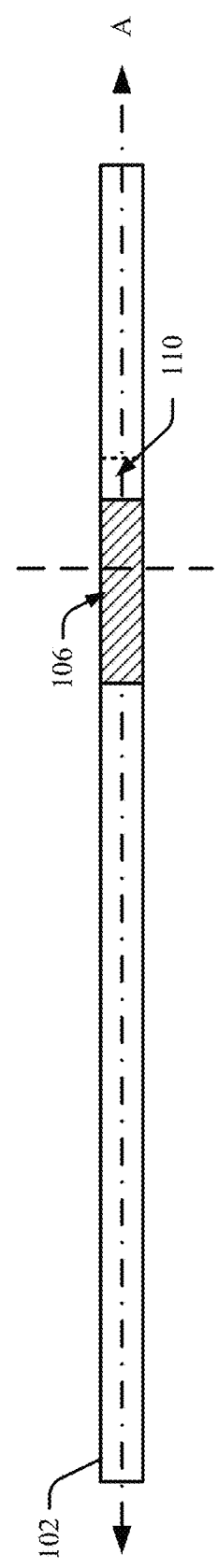
FIG. 2-1
FIG. 2-2

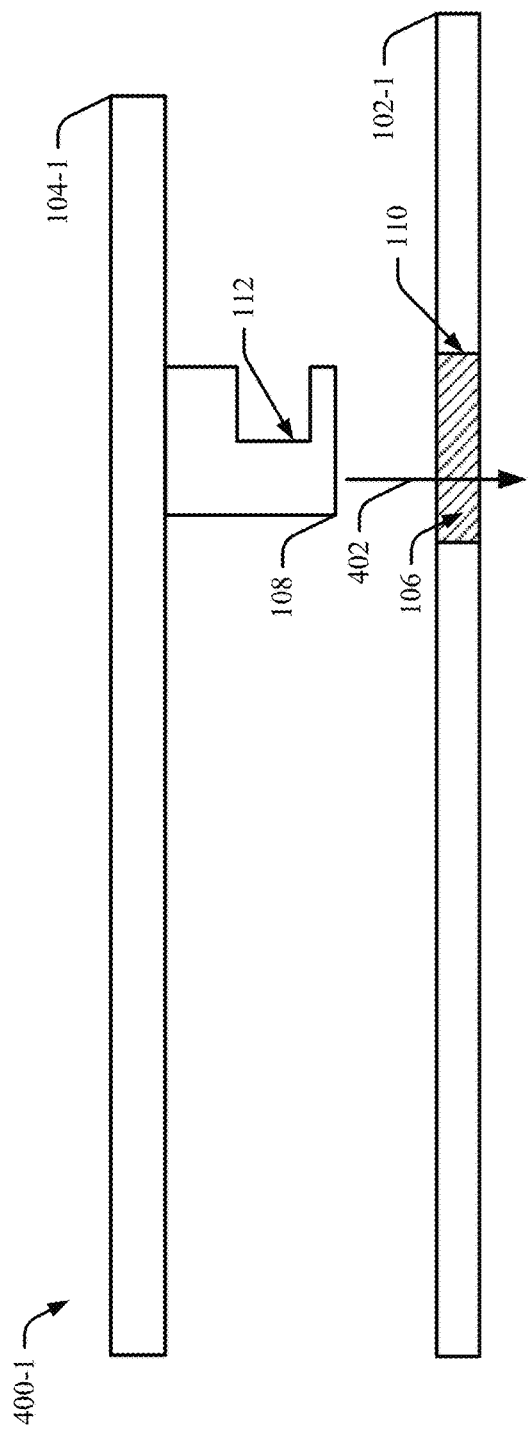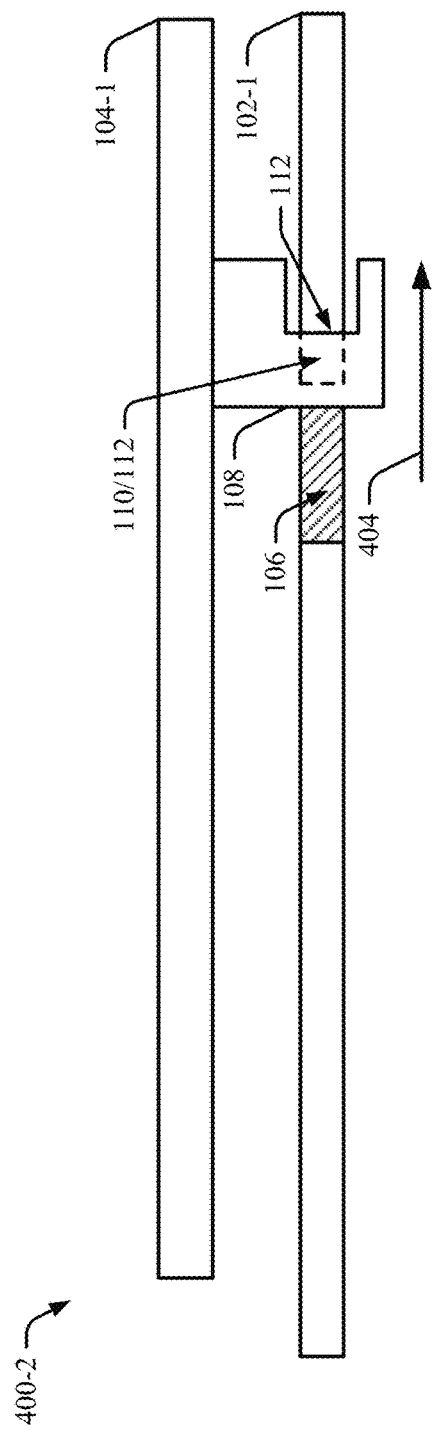

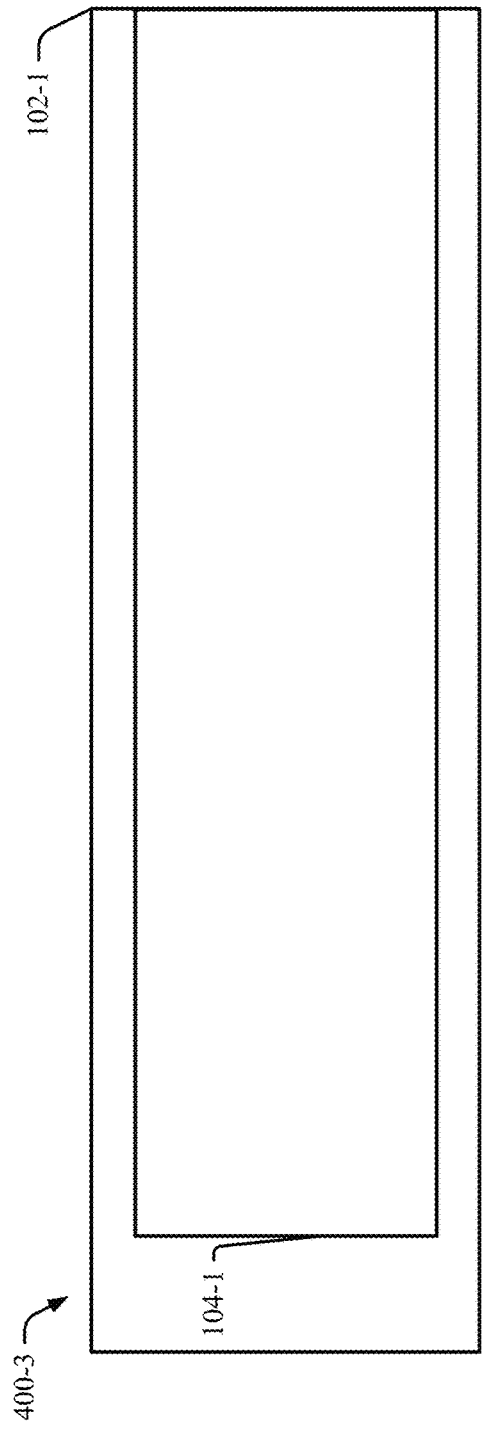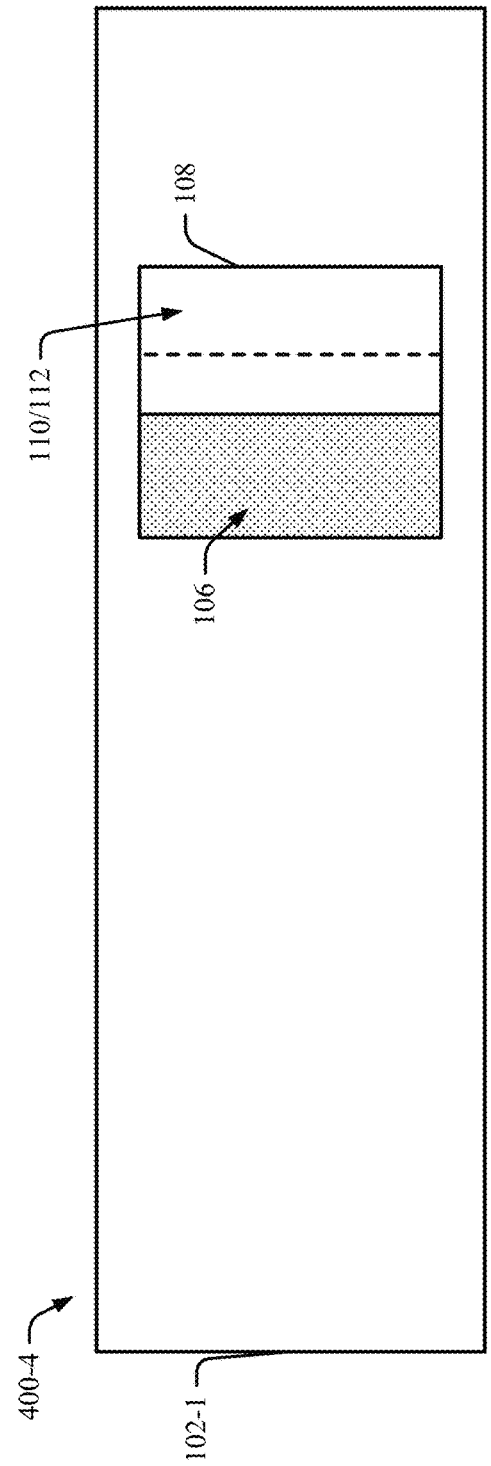

CIRCUIT BOARD CONNECTION SYSTEM, APPARATUS, AND METHOD

CROSS-REFERENCE TO RELATED APPLICATIONS

This application claims priority to European Patent Application Number 22178094.3, filed Jun. 9, 2022, which claims the benefit of U.S. Provisional Patent Application No. 63/227,043, filed Jul. 29, 2021, the disclosures of which are incorporated by reference herein in their entireties.

BACKGROUND

Some devices may include a printed circuit board (PCB), which when configured as a first, main board, has one or two surfaces that support components, circuitry, and electrical connectors for interfacing with other devices and systems, including device-auxiliary boards. To facilitate the connection of a second, auxiliary or 'daughter' board, for instance to provide additional or upgraded functionality, an electrical connector mounted to the main or 'parent' board may be used to physically (e.g., mechanically) and electrically link the main board to components and circuitry of the auxiliary board. For example, the electrical connector may physically-secure an entire edge, or portion thereof, of an auxiliary board to a surface of the main board. The electrical connector can provide a right-angled or straight connection. Straight or flat interfaces facilitate co-planar or parallel extensions of the surface of the main board; right-angled interfaces extend the surface of the main board in an orthogonal direction. When mated to the connector, electrical contacts at a secured portion of an auxiliary board are electrically coupled to corresponding contacts within the connector. A disadvantage with such conventional arrangements is that the resultant assembly of a main board and an auxiliary board mounted flat or orthogonally is very large. Furthermore, even when an auxiliary board is not provided initially, space to accommodate one needs to be provided as part of the design of a device housing into which the main board is mounted. As such, the significant space requirements of a combined assembly often apply even if no auxiliary board is ultimately attached.

Some auxiliary boards (e.g., mini PCIe) may also require main boards that support unique or specialized connectors, which add complexity and cost. The integration of such connectors into a main board may be unnecessary for some applications and hence unnecessary costs are incurred.

Accordingly, there remains a need to address the above shortcomings in printed circuit board connectors and assemblies.

SUMMARY

This document describes techniques and systems for enabling circuit board surface-slot-edge connections.

The present disclosure concerns a system for connecting circuit boards, as well as main and auxiliary circuit boards for use in the connected assembly. The present disclosure is particularly relevant circuit board arrangements for allowing expanded functionality on a first circuit board by connecting an auxiliary circuit board. The disclosure also concerns the method of assembly, and software for controlling the assembly process.

According to a first aspect there is provided a system, including: a first circuit board including a slot through two surfaces of the first circuit board and a first electronic interface provided at or adjacent an edge of the slot; and a second circuit board including a surface, and a connector component projecting from the surface and being configured for projecting through the slot, wherein the connector component includes a second electronic interface connectable to the first electronic interface once the connector component is positioned to project though the slot for establishing at least one electrical connection between the first and second circuit boards.

In embodiments, the connector component is configured to secure the second circuit board to the first circuit board at or adjacent the edge of the slot.

In embodiments, the first and second electrical interfaces each include a plurality of electrical contacts and the connector component is configured to secure the second circuit board to the first circuit board to maintain electrical connections between the electrical contacts of the first and second electrical interfaces.

In embodiments, the connector component includes an engagement part configured to engage with the first circuit board at or adjacent to the slot for supporting the second circuit board relative to the first circuit board.

In embodiments, the engagement part includes a cut out for engaging around the two surfaces of the first circuit board.

In embodiments, the engagement part is configured to retain the edge or a portion of the edge of the slot.

In embodiments, the engagement part is configured to form a press fit fastening to the first circuit board at or adjacent an edge of the slot.

In embodiments, the engagement part is engaged with the first circuit board, the connector component is configured to support the second circuit board in a plane parallel to the first circuit board.

In embodiments, the first electronic interface is receivable into the second electronic interface.

In embodiments, the second electronic interface includes an interface port for receiving the first electronic interface.

According to a second aspect, there is provided an apparatus including: a first circuit board including a slot through two surfaces of the first circuit board, and a first electronic interface provided at or adjacent an edge of the slot, the first circuit board being configured to be received by a connector component of a second circuit board at or adjacent an edge of the slot when the connector component is positioned to project though the slot for connecting a second electronic interface of the connecting component to the first electronic interface for establishing at least one electrical connection between the first and second circuit boards.

According to a third aspect, there is provided an apparatus including: a second circuit board including a surface and a connector component projecting from the surface and being configured for projecting through a slot through two surfaces of a first circuit board, wherein the connector component includes a second electronic interface connectable to a first electronic interface of the first circuit board once the connector component is positioned to project though the slot for establishing at least one electrical connection between the first and second circuit boards.

According to a fourth aspect, there is provided a method including: providing a first circuit board having a slot through two surfaces and a first electronic interface provided at or adjacent an edge of the slot; providing a second circuit board having a surface, and a connector component projecting from the surface and being configured for projecting through the slot, wherein the connector component includes a second electronic interface; arranging the connector component above or below the first circuit board and aligned with the slot; and moving the connector component relative to the first circuit board to insert the connector component into the slot and to engage the first and second electronic interfaces for establishing at least one electrical connection between the first and second circuit boards.

In embodiments, the step of moving the connector component includes inserting the connector component vertically into the slot and moving the connector component laterally to engage the second electronic interface with the first electronic interface.

According to a fifth aspect, there is provided a computer-readable storage medium including instructions that, when executed, cause a processor to control an assembly machine to perform the above method.

In embodiments, the assembly machine comprises one or more robots for performing the above method. In embodiments, the computer-readable storage medium includes instructions that, when executed, cause a processor to control the one or more robots through a connection interface.

Other examples set forth herein are directed to systems and apparatus, including systems with means for performing these methods. This Summary introduces simplified concepts for enabling circuit board surface-slot-edge connections, as further described in the Detailed Description and Drawings. This Summary is not intended to identify essential features of the claimed subject matter, nor is it intended for use in determining the scope of the claimed subject matter.

BRIEF DESCRIPTION OF THE DRAWINGS

Illustrative embodiments incorporating circuit board surface-slot-edge connections will now be described with reference to the accompanying drawings in which:

FIG. 2-1 illustrates a top-down or bottom-up view of a circuit board including a surface-slot-edge connection, in accordance with techniques of this disclosure;

FIG. 2-2 illustrates a cross-sectional side-view of the circuit board shown in FIG. 2-1;

FIG. 3-1 illustrates a top-down view of a circuit board including an under-surface mounted connector component that is configured to engage with a surface-slot-edge connection, in accordance with techniques of this disclosure;

FIG. 3-2 illustrates a bottom-up view of the circuit board shown in FIG. 3-1 to show the under-surface mounted connector that is configured to engage with a surface-slot-edge connection, in accordance with techniques of this disclosure;

FIG. 3-3 illustrates a side-view of the circuit board shown in FIG. 3-1;

FIG. 3-4 illustrates a cross-sectional, bottom-up view of the circuit board shown in FIGS. 3-3;

FIGS. 4-1 through 4-4 illustrate conceptual diagrams of a main board making surface-slot-edge connection with a connector component of an auxiliary board, in accordance with techniques of this disclosure.

The same numbers are often used throughout the drawings to reference like features and components, including hyphenated numbers to designate variations of the like features and components previously shown.

DETAILED DESCRIPTION

Overview

A main board, such as a PCB, may include at least one surface that supports components, circuitry, and an electrical interface for interfacing with other devices and systems, including device-auxiliary boards. In conventional arrangements, an electrical connector may be mounted to the surface of the main board to physically (e.g., mechanically) and electrically link the main board to components and circuitry of an auxiliary board. For example, the electrical connector may physically-secure an entire edge, or portion thereof, of an auxiliary board to a surface of the main board, thereby providing an orthogonal or straight connection between the two. When mated to the connector, electrical contacts at a secured portion of an auxiliary board are electrically coupled to corresponding contacts within the connector. Embodiments described herein provide for more affordable and compact devices, by avoiding the need to provide main boards with specialized connectors and surface extensions in parallel and orthogonal directions.

Techniques and systems for enabling circuit board surface-slot-edge connections are described. In embodiments, a first, main board includes a slot through surfaces of the main board. At least one edge of the slot includes electrical contacts to the main board. A second, auxiliary board includes a connector component mounted on a surface of the auxiliary board that opposes a surface of the main board. When the connector component is aligned with the slot, the connector component can be inserted to protrude vertically (e.g., perpendicularly) through the slot. The connector component may then be moved laterally towards an edge of the slot. Electrical contacts on the edge of the slot can then engage with electrical contacts in the connector component. This enables two boards to be arranged closely, without extending the main surface in an orthogonal or lateral direction. At the same time, a secure connection may be provided using a connector attached to an auxiliary board, rather than mounted to the main board.

Example System

Figure 1:
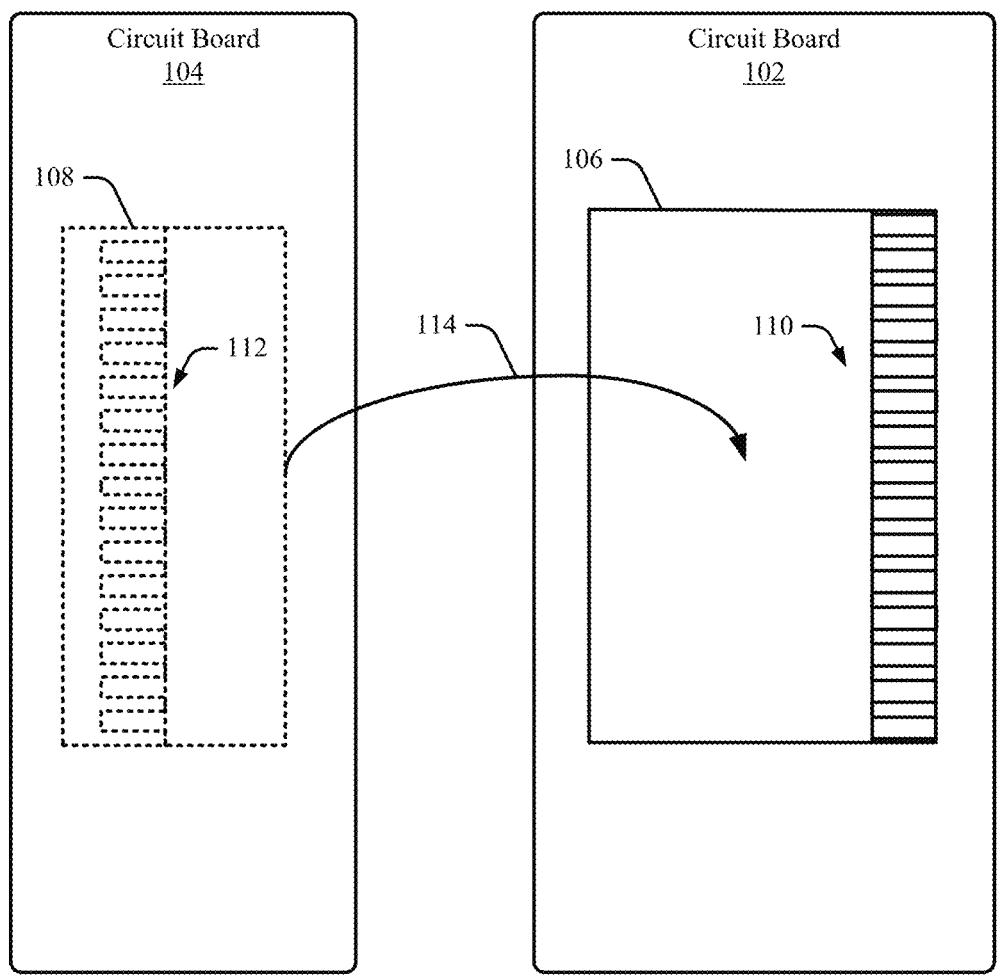
FIG. 1 illustrates an example system that uses circuit board surface-slot-edge connections, in accordance with techniques of this disclosure.

FIG. 1 illustrates an example system 100 that uses circuit board surface-slot-edge connections, in accordance with techniques of this disclosure. The system 100 can be part of any type of device where circuit boards are used. For example, the system 100 may be part of a computer system (e.g., a server, a workstation), a vehicle (e.g., an automotive system, an aircraft system), a robot, a satellite, an industrial system (e.g., a power plant), or other application where circuit boards are used.

The system 100 includes two circuit boards, a circuit board 102 and a circuit board 104, and each is shown in FIG. 1 in a top-down view. The circuit boards 102 and 104 may be formed of a substrate or other material. The circuit board 102 may be a main circuit board, and the circuit board 104 may be an auxiliary circuit board. The circuit boards 102 and 104 may support a variety of components and circuitry (e.g., chips, processors, memories, wires, traces), however, for ease of description and simplicity in the drawings, details of the circuit boards 102 and 104 are omitted and only those features that enable surface-slot-edge connections are shown.

To enable surface-slot-edge connections between the circuit boards 102 and 104, a slot 106 protrudes through the circuit board 102, leaving a hole or window through both surfaces of the circuit board 102. In addition, a connector component 108 is mounted to an under surface of the circuit board 104. The slot 106 and the connector component 108 can be of a variety of shapes and sizes, including rectangular, square, circular, irregular, or other shape. The connector component 108 is generally sized to be smaller than the slot 106 to allow the connector component 108 to move vertically and laterally within the slot 106. The slot 106 includes an electrical interface 110 at an edge of the slot 106. Accordingly, electrical contacts may be provided on the first circuit board 102 at or adjacent to the periphery of the slot 106, for example along the slot's longitudinal edges or at the edges forming its corners. The connector component 108 also includes an electrical interface 112 configured to mate with the electrical interface 110 when the connector component 108 is engaged in the slot 106. In embodiments, the electrical interface 112 on the second circuit board 104 may be provided as an interface port or slot for receiving the electrical interface 110 on the first circuit board 102.

The slot 106 and the connector component 108 are configured to provide surface-slot-edge connections between the circuit boards 102 and 104. The connections enable close positioning of opposing surfaces of the two circuit boards 102 and 104, which facilitates integration in a small form factor. In addition, the connections do not extend the surface of the circuit board 102 in an orthogonal direction, nor do they necessarily extend the circuit board 104 past the edges of the circuit board 102, each of which likewise facilitates integration in a small form factor.

Directional arrow 114 illustrates a formation of a surface-slot-edge connection. When the circuit board 104 moves with the directional arrow 114, it becomes aligned in parallel with the circuit board 102. In particular, the connector component 108 on the underside of the circuit board 104 is positioned above or below the slot 106. At this point, the two circuit boards 102 and 104 may be brought closer together. This causes the connector component 108 to protrude into the slot 106. With the connector component 108 vertically arranged through the slot 106, the circuit board 104 can be moved laterally further with the directional arrow 114, and towards the edge of the slot 106 where the electrical interface 110 (e.g., electrical contacts) can engage with the electrical interface 112 (e.g., electrical contacts) in the connector component 108 positioned within in the slot 106. In this way, the two boards 102 and 104 can be arranged closely in parallel, with a secure surface-slot-edge connection provided by the connector component 108 attached to the circuit board 104.

By including a connector component on an auxiliary board, and not on a surface of a main board, a surface-slot-edge connection may achieve a significant cost benefit over other connection techniques. In addition, a surface-slot-edge connection enables PCB designs in which the connection is provided from most locations within a surface of a PCB. As such, connections are not restricted to one edge of the PCB and hence improved circuit design flexibility may be facilitated. For example, the length of connection traces, such as those carrying high-speed signals, can be shortened.

Example Main Board

Figures 1, 3:
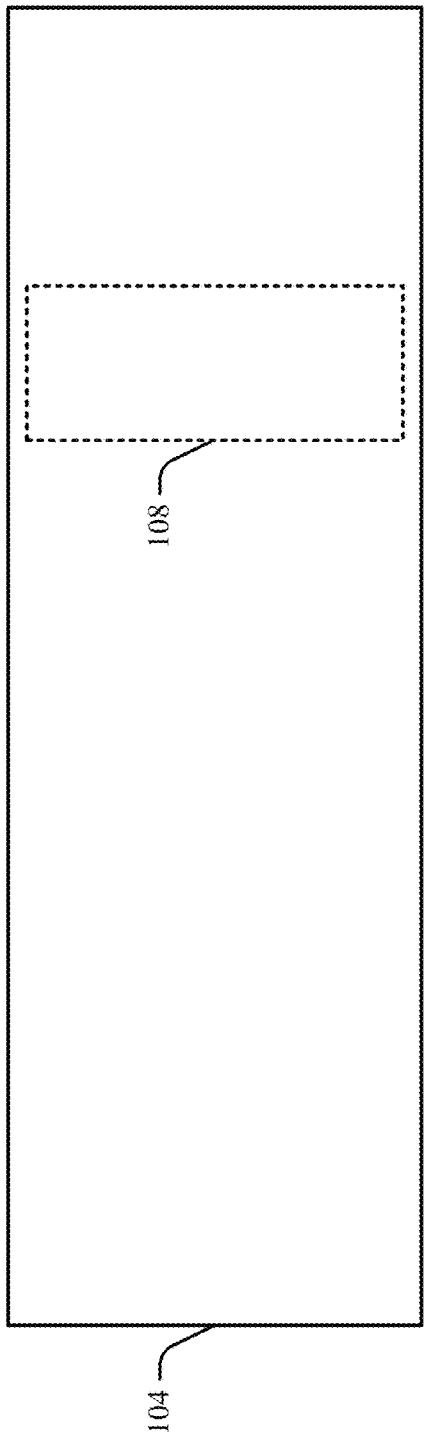
Figures 2, 3:
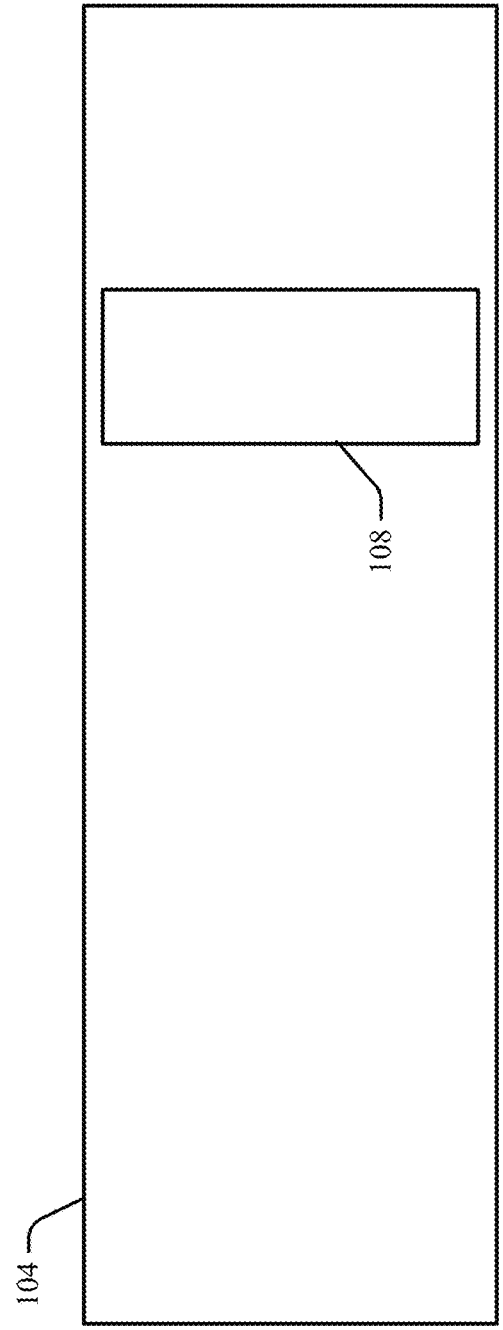
Figure 3:
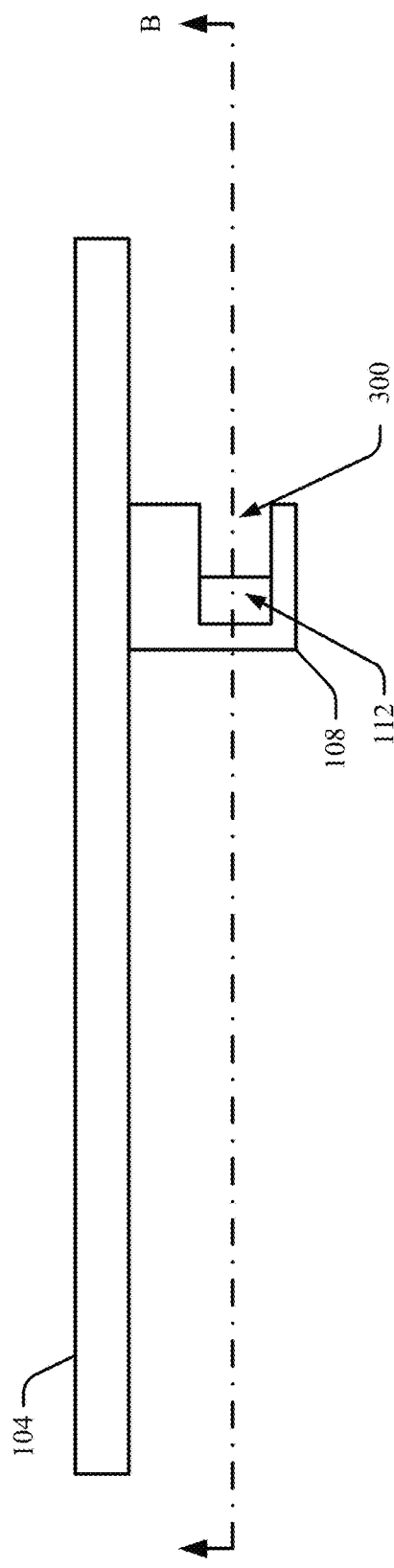

FIG. 2-1 illustrates a top-down or bottom-up view of a circuit board including a surface-slot-edge connection, in accordance with techniques of this disclosure. The circuit board 102 is shown having the slot 106 and at one edge of the slot 106, the electrical interface 110. FIG. 2-2 illustrates a cross-sectional side-view of the circuit board shown in FIG. 2-1. The circuit board 102 is shown having the slot 106 through the two surfaces of the circuit board. The cross-section A bisects the slot and shows a portion of the electrical interface 110 on the edge of the slot 106. The electrical interface 110 may be at or near a surface of the circuit board 102, or within the slot 106 (e.g., on a wall of the slot 106).

Example Auxiliary Board

FIG. 3-1 illustrates a top-down view of a circuit board including an under-surface mounted connector component that is configured to engage with a surface-slot-edge connection, in accordance with techniques of this disclosure. The circuit board 104 is shown without any components shown on a top surface that is opposite a surface that supports the connector component 108 (shown in dotted line form), although many components or circuitry may be positioned on the top surface or bottom surface of the circuit board 104. FIG. 3-2 illustrates a bottom-up view of the circuit board shown in FIG. 3-1 to show the under-surface mounted connector that is configured to engage with a surface-slot-edge connection, in accordance with techniques of this disclosure. An outline of the connector component 108 is shown in this view, although the cut out 300 and the electrical interface 112, as described below, is not shown.

FIG. 3-3 illustrates a side-view of the circuit board shown in FIG. 3-1. From the side-view, the connector component 108 is shown mounted to an under surface of the circuit board 104. The connector component 108 may include a cut out 300 that provides support and helps to physically secure the second circuit board 104 once connected, for example by forming a press-fit when engaged with the opposing surfaces of the first circuit board 102. As such, the cut out 300 acts as a retention feature to help maintain connection between the connector component 108, and an edge of a slot (e.g., the slot 106). Opposite an opening to the cut out 300 that receives the slot 106, the connector component 108 includes the electrical interface 112.

Figures 3, 4:
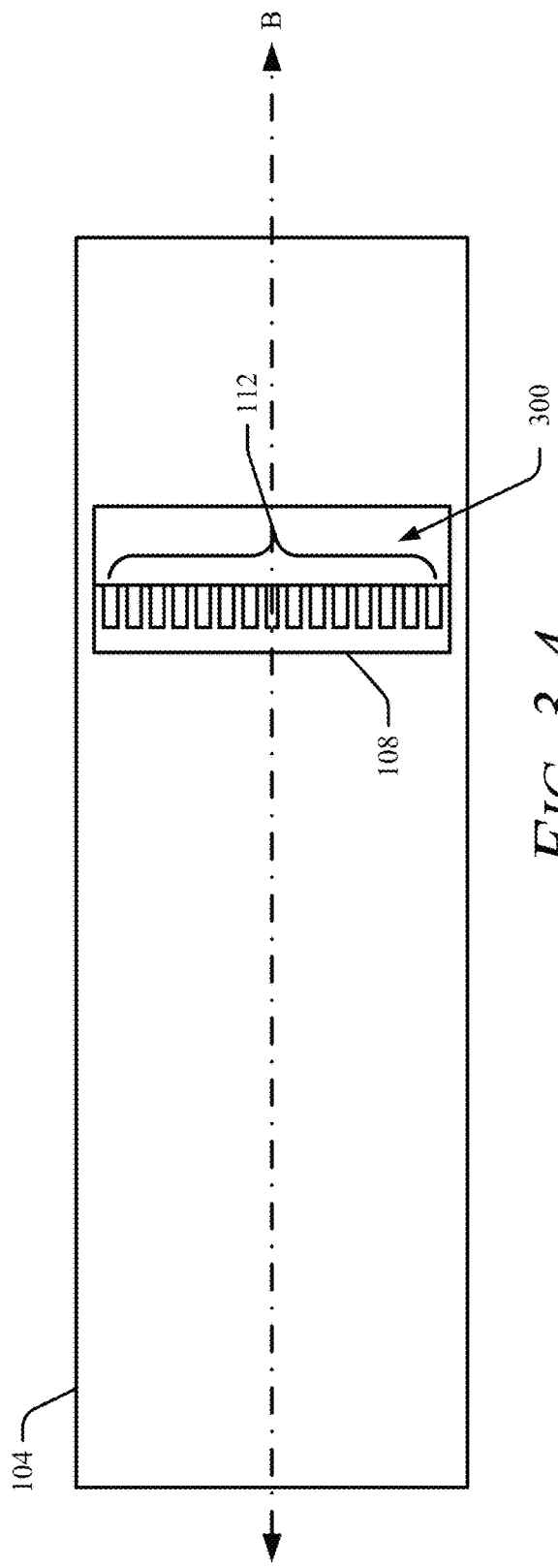

FIG. 3-4 illustrates a cross-sectional, bottom-up view of the circuit board shown in FIGS. 3-3. From this view, inner details of the connector component 108 are shown, including the electrical interface 112, which extends the length of the connector component 108, while leaving some empty space within the cut out 300 for receiving the circuit board 102.

Example Scenario

FIGS. 4-1 and 4-4 illustrate conceptual diagrams a main board making a surface-slot-edge connection with a connector component of an auxiliary board, in accordance with techniques of this disclosure. Turning to FIG. 4-1, in conceptual diagram 400-1, a main board 104-1 is positioned above a surface of an auxiliary board 102-1, to align the connector component 108 of the auxiliary board 102-1 to the slot 106 of the main board 104-1. By moving the main board 104-1 vertically closer to the auxiliary board 102-1, the connector component 108 can move, vertically into the slot 106 such that it is inserted through the slot 106 in a vertical direction 402. The vertical direction 402 of travel of the connector component 108 is orthogonal to the surface of the main board 102-1 with the slot 106.

In conceptual diagram 400-2 of FIG. 4-2, the auxiliary board 104-1 is allowed to move in a lateral direction 404 (orthogonal to the vertical direction 402), towards an edge of the slot 106. During assembly, this enables the interface 112 on the connector component 108 of the auxiliary board 104-1 to contact and engage the interface 110 on the slot 106. FIG. 4-2 illustrates that there may be some overlap between the interfaces 110 and 112.

FIGS. 4-3 and 4-4 show conceptual diagrams 400-3 and 400-4, which illustrate the auxiliary board 104-1 and the main board 102-1 after having formed a surface-slot-edge connection between them. The conceptual diagram 400-3 shows a top-down view of the auxiliary board 104-1 stacked over the surface of the main board 102-1. The conceptual diagram 400-4 shows a bottom-up view of the main board 102-1, including the connector component 108 of the auxiliary board 104 protruding through the slot 106 and engaging the interfaces 110 and 112.

Example Processes

Figure 5:
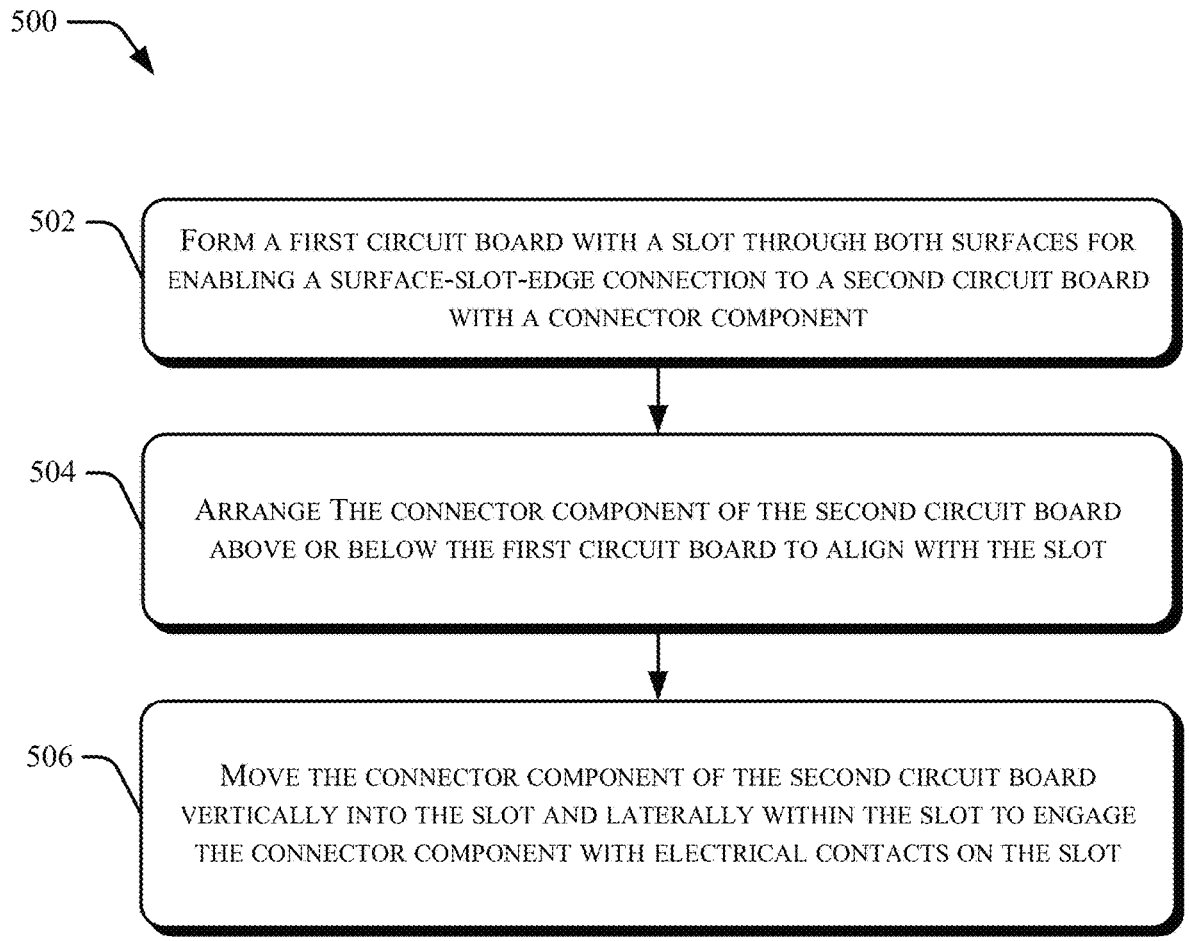
FIG. 5 illustrates a flow diagram of an example process to form a surface-slot-edge connection between two circuit boards, in accordance with techniques of this disclosure.

FIG. 5 illustrates a flow diagram of an example process 500 to form a surface-slot-edge connection between two circuit boards, in accordance with techniques of this disclosure. The operations of the process 500 may be rearranged, skipped, repeated, or performed in different ways than the specific flow shown in the diagram. A processor of a computer system, computer hardware components, a controller, a control unit, or other computer may perform the process 500 by controlling an automated production line based on robots to form the system 100, as shown in FIG. 1. For example, manufacturing equipment, three-dimensional printing technology, and the like, may execute the process 500 to arrange form a surface-slot-edge connection between main and auxiliary boards.

At 502, a first circuit board with a slot through both surfaces for enabling a surface-slot-edge connection to a second circuit board with a connector component is formed. For example, the circuit board 102 including the slot 106 is formed. The slot 106 is sized and shaped to accommodate the connector component 108, including, by integrating the interface 110 on an edge of the slot 106 to electrically couple the interface 112 on the connector component 108 to the interface 110 on the slot 106.

At 504, a connector component of the second circuit board is arranged above or below the first circuit board and aligned with the slot. For example, the circuit board 104 is arranged with the connector component 108 positioned over the slot 106 of the circuit board 102.

At 506, the connector component of the second circuit board is moved vertically into the slot and laterally within the slot to engage the connector component with electrical contacts on the slot. For example, the circuit board 104 is arranged closer to the circuit board 102 so that the connector component 108 can move in the vertical direction 402, into the slot 106, and in the lateral direction 404, towards the edge with the interface 110.

Additional Examples

Some additional examples of circuit board surface-slot-edge connections include the following:

Example 1. A system, comprising: a first circuit board comprising a slot through two surfaces of the first circuit board, an edge of the slot including an electrical contact to the first circuit board; and a second circuit board comprising a connector component on an opposite side of one of the two surfaces of the first circuit board, the connector component being arranged in the slot and configured to contact the electrical contact at the edge of the slot.

Example 2. The system of any preceding example, wherein the connector component is configured to secure the second board to the slot of the first circuit board.

Example 3. The system of any preceding example, wherein the connector component is configured to secure the second board to the slot of the first circuit board to maintain an electrical connection between contacts of the connector component and the electrical contact at the edge of the slot.

Example 4. The system of any preceding example, wherein the connector component includes a cut out configured to provide support and physical security between the connector component and the edge of the slot.

Example 5. The system of any preceding example, wherein the cut out is configured to retain an entire edge or portion of an edge of the slot.

Example 6. An apparatus comprising: a main circuit board comprising a slot through two surfaces of the main circuit board, an edge of the slot including an electrical contact to the main circuit board, the edge of the slot configured to be received by a cut out of a connector component of an auxiliary circuit board when the connector component is positioned within the slot.

Example 7. An apparatus comprising: an auxiliary circuit board comprising one surface with a connector component configured to engage with an edge of a slot through two surfaces of a main circuit board when the connector component is positioned within the slot.

Example 8. A method comprising: forming a first circuit board with a slot through both surfaces for enabling a surface-slot-edge connection to a second circuit board with a connector component; forming the second circuit board with the connector component on one surface of the second circuit board; arranging the connector component above or below the first circuit board and aligned with the slot; and moving the connector component vertically into the slot and laterally within the slot to engage electrical contacts in the connector component with electrical contacts on a edge of the slot.

Example 9. A computer-readable storage medium comprising instructions that, when executed, cause a processor to control an automatized robot production line to perform the method of any preceding example.

Example 10. An automatized robot production line system comprising a processor configured to perform the method of any preceding example.

Example 11. A system comprising means for performing the method of any preceding example.

CONCLUSION

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the scope of the disclosure as defined by the following claims. In addition to printed circuit board connections, problems associated with electrical connections for other electrical or computer systems can be overcome using the described techniques. Therefore, although described as a way to improve main-to-daughter board connections, the techniques of the foregoing description can be adapted and applied to other problems to electrically couple to components.

The use of "or" and grammatically related terms indicates non-exclusive alternatives without limitation unless the context clearly dictates otherwise. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

Finally, it is also envisaged that other arrangements may be provided in which the first circuit board comprises a cut-out or notch in its peripheral edge, rather than a slot. In such arrangements, a first electronic interface for the first circuit board may be provided at or adjacent an edge of the notch. The second circuit board may again include a connector component projecting from its surface, with this connector component being configured to align with the notch such that it may extend between the notch to enable the second electronic interface to be connectable to the first electronic interface. Accordingly, as with the embodiments described above, at least one electrical connection between the first and second circuit board may be established, with the first and second circuit boards being arranged closely in parallel, with a secure surface-notch-edge connection. Therefore, as with the above embodiments, a compact assembly of a main and auxiliary circuit board may be provided, whilst locating the specialized connector on the auxiliary board. At the same time, the indentation forming the notch at the edge of the circuit board may thereby allow the space on the first circuit board to be maximized.

What is claimed is:

1. A system, comprising:
   a first circuit board comprising a slot through two surfaces of the first circuit board and a first electronic interface provided at or adjacent an edge of the slot; and
   a second circuit board comprising a surface, and a connector component projecting from the surface and being configured for projecting through the slot,
   wherein the connector component comprises a second electronic interface connectable to the first electronic interface once the connector component is positioned to project though the slot for establishing at least one electrical connection between the first and second circuit boards,
   wherein the connector component includes an engagement part configured to engage with the first circuit board at or adjacent to the slot for supporting the second circuit board relative to the first circuit board, and
   wherein the engagement part comprises a cut out for engaging around the two surfaces of the first circuit board.

2. The system of claim 1, wherein the connector component is configured to secure the second circuit board to the first circuit board at or adjacent the edge of the slot.

3. The system of claim 1, wherein the first and second electrical interfaces each comprise a plurality of electrical contacts and the connector component is configured to secure the second circuit board to the first circuit board to maintain electrical connections between the electrical contacts of the first and second electrical interfaces.

4. The system of claim 1, wherein the engagement part is configured to retain the edge or a portion of the edge of the slot.

5. The system of claim 1, wherein the engagement part is configured to form a press fit fastening to the first circuit board at or adjacent an edge of the slot.

6. The system of claim 1, wherein, when the engagement part is engaged with the first circuit board, the connector component is configured to support the second circuit board in a plane parallel to the first circuit board.

7. The system of claim 1, wherein the first electronic interface is receivable into the second electronic interface.

8. The system of claim 7, wherein the second electronic interface comprises an interface port for receiving the first electronic interface.

9. The system of claim 1, wherein the second electronic interface is located opposite an opening to the cut out.

10. The system of claim 1, wherein the engagement part is configured to form a press-fit fastening to the first circuit board at or adjacent an edge of the slot.

11. An apparatus comprising:
    a circuit board comprising a surface and a connector component projecting from the surface and being configured for projecting through a slot through two surfaces of a mating circuit board, wherein the connector component comprises an electronic interface connectable to a mating electronic interface of the mating circuit board once the connector component is positioned to project though the slot for establishing at least one electrical connection between the respective circuit boards,
    wherein the connector component includes an engagement part configured to engage with the circuit board at or adjacent to the slot for supporting the mating circuit board relative to the circuit board, and
    wherein the engagement part comprises a cut out for engaging around the two surfaces of the circuit board.

12. A method comprising:
    providing a first circuit board having a slot through two surfaces and a first electronic interface provided at or adjacent an edge of the slot;
    providing a second circuit board having a surface, and a connector component projecting from the surface and being configured for projecting through the slot, wherein the connector component comprises a second electronic interface;
    arranging the connector component above or below the first circuit board and aligned with the slot; and
    moving the connector component relative to the first circuit board to insert the connector component into the slot and to engage the first and second electronic interfaces for establishing at least one electrical connection between the first and second circuit boards, wherein moving the connector component comprises inserting the connector component vertically into the slot and moving the connector component laterally to engage the second electronic interface with the first electronic interface.

13. The method of claim 12, wherein the method is executed by a processor controlling an assembly machine based in instructions on a computer-readable storage medium.

14. The method of claim 12, wherein the connector component is configured to secure the second circuit board to the first circuit board at or adjacent the edge of the slot.

15. The method of claim 12, wherein the first and second electrical interfaces each comprise a plurality of electrical contacts and the connector component is configured to secure the second circuit board to the first circuit board to maintain electrical connections between the electrical contacts of the first and second electrical interfaces.

16. The method of claim 12, wherein the connector component includes an engagement part configured to engage with the first circuit board at or adjacent to the slot for supporting the second circuit board relative to the first circuit board.

17. The method of claim 12, wherein the first electronic interface is receivable into the second electronic interface.

18. The method of claim 17, wherein the second electronic interface comprises an interface port for receiving the first electronic interface.

\* \* \* \* \*